(12) United States Patent
Schuster

(10) Patent No.: US 10,352,634 B2
(45) Date of Patent: Jul. 16, 2019

(54) COOLING APPARATUS FOR POWER ELECTRONIC COMPONENTS

(71) Applicant: Liebherr-Components Biberach GmbH, Biberach an der Riss (DE)

(72) Inventor: Wolfgang Schuster, Bad Waldsee (DE)

(73) Assignee: Liebherr-Components Biberach GmbH, Biberach an der Riss (DE)

(*) Notice: Subject to any disclaimer, the term of this patent is extended or adjusted under 35 U.S.C. 154(b) by 129 days.

(21) Appl. No.: 15/032,012

(22) PCT Filed: Oct. 24, 2014

(86) PCT No.: PCT/EP2014/002874
§ 371 (c)(1),
(2) Date: Apr. 25, 2016

(87) PCT Pub. No.: WO2015/058859
PCT Pub. Date: Apr. 30, 2015

(65) Prior Publication Data
US 2016/0273853 A1    Sep. 22, 2016

(30) Foreign Application Priority Data

Oct. 25, 2013 (DE) .................... 10 2013 017 812

(51) Int. Cl.
*F28F 27/00* (2006.01)
*H01L 23/473* (2006.01)
(Continued)

(52) U.S. Cl.
CPC .............. *F28F 27/00* (2013.01); *F28D 15/00* (2013.01); *F28F 3/12* (2013.01); *G01F 1/34* (2013.01);
(Continued)

(58) Field of Classification Search
CPC ...... F28F 3/12; G01F 1/44; G01F 1/34; H01L 23/473; F28D 15/00; F28D 27/00
(Continued)

(56) References Cited

U.S. PATENT DOCUMENTS 3,875,955 A * 4/1975 Gallatin .................. G01F 1/363
137/14
8,018,718 B2 * 9/2011 Goth ........................ F25B 49/02
165/80.3
(Continued)

FOREIGN PATENT DOCUMENTS

DE          9315513 U1    12/1993
DE    202006012950 U1    10/2006
(Continued)

OTHER PUBLICATIONS

ISA European Patent Office, International Search Report Issued in Application No. PCT/EP2014/002874, dated Mar. 16, 2015, WIPO, 4 pages.

*Primary Examiner* — Devon Russell
(74) *Attorney, Agent, or Firm* — McCoy Russell LLP

(57) ABSTRACT

A cooling apparatus for power electronic devices having at least one cooling body comprised of a cooling plate in contact with at least one power electronic component, and having a coolant line which leads through the cooling plate, wherein a device is provided for determining the flow quantity. The coolant line has a cross-sectional tapering in the cooling plate, with at least two measurement ports for connecting a differential pressure gauge for measuring a pressure difference at the two ports, wherein one is downstream of the cross-sectional tapering at the cooling plate. The flow determination device comprises an evaluation device for determining the flow quantity from the measured pressure difference. The cross-sectional tapering is configured as a venturi element, wherein the constriction is tapped (Continued)

after the tapering and the wide point is tapped before the tapering with a measurement port to determine the pressure difference adopted over the venturi nozzle.

4 Claims, 7 Drawing Sheets

(51) Int. Cl.
*G01F 1/34* (2006.01)
*F28F 3/12* (2006.01)
*F28D 15/00* (2006.01)
*G01F 1/44* (2006.01)

(52) U.S. Cl.
CPC .............. *G01F 1/44* (2013.01); *H01L 23/473* (2013.01); *H01L 2924/0002* (2013.01)

(58) Field of Classification Search
USPC ................................ 165/80.5, 246, 281, 286
See application file for complete search history.

(56) References Cited

U.S. PATENT DOCUMENTS

| | | | |
|---|---|---|---|
| 9,398,722 B1* | 7/2016 | Sykes | H05K 7/20272 |
| 2003/0085024 A1 | 5/2003 | Santiago et al. | |
| 2004/0249583 A1* | 12/2004 | Eryurek | G01F 1/363 |
| | | | 702/47 |
| 2011/0056675 A1* | 3/2011 | Barringer | H05K 7/20736 |
| | | | 165/299 |
| 2011/0058637 A1* | 3/2011 | Campbell | F28D 15/00 |
| | | | 376/283 |
| 2011/0112694 A1* | 5/2011 | Bash | F24F 11/0001 |
| | | | 700/277 |
| 2011/0162742 A1* | 7/2011 | Ulens | F24D 19/1015 |
| | | | 137/624.27 |
| 2012/0041600 A1* | 2/2012 | Michael | G05D 23/1932 |
| | | | 700/276 |
| 2013/0025818 A1* | 1/2013 | Lyon | H05K 7/20781 |
| | | | 165/11.1 |
| 2013/0035030 A1* | 2/2013 | Bach | F24F 11/00 |
| | | | 454/256 |
| 2014/0102122 A1* | 4/2014 | Aso | F25B 17/083 |
| | | | 62/101 |
| 2014/0240916 A1* | 8/2014 | Daidzic | B23P 15/26 |
| | | | 361/679.46 |
| 2014/0260670 A1* | 9/2014 | Strom | G01F 1/42 |
| | | | 73/861.42 |
| 2014/0360714 A1* | 12/2014 | Matsuo | F24F 11/008 |
| | | | 165/284 |

FOREIGN PATENT DOCUMENTS

| | | | | |
|---|---|---|---|---|
| DE | 102006040187 B4 | 12/2009 | | |
| DE | 202012001323 U1 | 2/2012 | | |
| EP | 0524757 A1 | 1/1993 | | |
| JP | H11089213 A | 3/1999 | | |
| JP | WO 2013005285 A1 * | 1/2013 | ............ | F23B 17/083 |

* cited by examiner

COOLING APPARATUS FOR POWER
ELECTRONIC COMPONENTS

CROSS REFERENCE TO RELATED
APPLICATIONS

The present application is a U.S. National Phase of International Patent Application Serial No. PCT/EP2014/002874, entitled "Cooling Device for Power Electronic Components," filed on Oct. 24, 2014, which claims priority to German Patent Application No. 10 2013 017 812.6 filed on Oct. 25, 2013, the entire contents of each of which are hereby incorporated by reference in their entirety for all purposes.

TECHNICAL FIELD

The present invention relates to a cooling apparatus for power electronic devices having at least one cooling body in the form of a cooling plate which is in contact with at least one power electronic component to be cooled and having a coolant line which can be flowed through by a coolant and which leads through the cooling plate, wherein flow determination means are provided for determining the flow quantity flowing through the cooling body.

BACKGROUND AND SUMMARY

Power electronic components and devices such as power semiconductors and frequency converters or computer components such as processors and the like are frequently cooled by cooling bodies in the form of cooling plates in which a coolant line is provided, for example shaped in meandering form, to be able to conduct a coolant, for example in the form of a liquid such as water, liquid nitrogen or the like, through the cooling plate. The power electronic components are in contact with the cooling plate to be able to discharge their heat into the cooling plate from where it is then transported away through the cooling medium flowing through. The components to be cooled can in this respect be installed directly on the cooling plate or can be connected to the cooling plate while interposing one or more intermediate layers such as an intermediate layer improving the heat conduction and/or the heat transfer, for example in the form of a conductive paste, such that the aforesaid contact can be direct or indirect.

Such cooling apparatus for power electronic components are known, for example, from document DE 20 2006 012 950 U1 or DE 20 2012 001 323 U1, wherein the latter shows a cooling plate having an intake and a drain which are in flow communication with coolant line sections and pockets formed in the interior of the plate. Document DE 10 2006 040 187 B4 shows a similar cooling apparatus for power electronic components, wherein here a plurality of cooling modules are combined at common inflow manifolds and outflow collectors.

To be able to exactly control the cooling effect of such cooling plates and thus the heat removal of the relatively temperature-sensitive power electronic components, it is helpful to be able to exactly know and to be able to correspondingly control the flow quantity of the coolant flowing through a cooling plate. Flowmeters can be installed in or at the liquid line for determining the flow quantity through a cooling plate, wherein a plurality of such flow sensors are typically used on a use of a plurality of cooling plates. Such flowmeters, for example in the form of ultrasound sensors, are, however, relatively expensive so that high costs are incurred with more complex cooling apparatus. On the other hand, the cooling plates are in this respect often populated very tightly with the electronic components to be cooled such that at times there is only a little space or no space at all available for connecting the named flow sensors.

It is the underlying object of the present invention to provide an improved cooling apparatus of the initially named kind which avoids disadvantages of the prior art and further develops the latter in an advantageous manner. An improved, precise determination of the flow quantity should in particular be made possible with a simple and less expensive sensor system which saves as much space as possible.

The named object is achieved in accordance with the invention by a cooling apparatus for power electronic components having at least one cooling body in the form of a cooling plate which is in contact with at least one power electronic component to be cooled and having a coolant line which is flowed through by a coolant and which leads through the cooling plate, wherein a flow determination device is provided for determining a flow quantity flowing through the cooling plate, wherein the coolant line in the cooling plate has a cross-sectional tapering and has two measurement ports for connecting a differential pressure gauge for measuring a pressure difference at the two measurement ports, with one of the measurement ports being arranged at or directly downstream of the cross-sectional tapering and with the flow determination device comprising an evaluation device for determining the flow quantity from the pressure difference.

It is proposed no longer to determine the flow quantity by means of a plurality of flowmeters, but rather to determine the pressure difference at two suitable points of the coolant line which leads through the cooling body and to determine the flow quantity from the named pressure difference. In accordance with the invention, the coolant line has a cross-sectional tapering in the cooling plate, wherein at least two measurement ports are provided for connecting a differential pressure gauge for measuring a pressure difference at the two measurement ports of which one is provided at or directly downstream of the named cross-sectional tapering at the cooling plate. The flow determination means in this respect comprise an evaluation device for determining the flow quantity from the measured pressure difference. Since the geometry of the coolant line in general and in particular also in the region between the two measurement ports and also the properties of the coolant used, such as the viscosity, are known, the evaluation device can determine the flow quantity through the cooling plate with high precision from the measured pressure difference at the cross-sectional tapering in the cooling plate. The pressure measurement and the pressure sensor system provided for it is substantially less expensive than flowmeters, wherein the design of the cooling plate per se can also be kept simple by the provision of the two measurement ports.

In a further development of the invention, the liquid line between the two measurement ports can have a cross-sectional tapering in the form of a Venturi element. Such a Venturi element can comprise a nozzle-shaped pipe tapering or line tapering, wherein the lowest pressure is adopted at the narrowest point of the line, i.e. where the cross-section is the narrowest and the flow speed is the highest. The dynamic pressure becomes maximum and the static pressure becomes minimal at the constriction of the Venturi nozzle when the liquid cooling medium flows through the Venturi nozzle. On a use of such a cross-sectional tapering or of a Venturi element, the constriction after the tapering and the wide point before the tapering can advantageously be tapped by means of a respective measurement port in order to determine the pressure difference adopted over the cross-sectional tapering by means of the differential pressure sensor.

The Venturi element can in particular form a constriction which is, for example, cylindrical or at least rotationally symmetrical or shaped in another manner and which is adjoined upstream and downstream by inflow and outflow sections with a continuously varying diameter. The named inflow and outflow sections can advantageously be rotationally symmetrical and can form harmoniously shaped tapering or flaring sections which can constantly or harmoniously continue the diameter and/or the cross-section of the constriction in a gently merging manner. The named inflow and outflow sections can, for example, each have a conical contour and can adjoin the constriction in a step-free manner. The Venturi element can preferably form a harmoniously shaped Venturi nozzle.

In a further development of the invention, one of the measurement ports can be provided at the constriction of the Venturi element, whereas another measurement port can be arranged upstream of the inflow section of the Venturi element, in particular in a still untapered section of the coolant line in the cooling plate directly upstream of the inflow section.

In order to be able to provide a nozzle-shaped cross-sectional change not only on one side, but rather on both sides of the constriction of the Venturi element with a reasonable production effort, the Venturi element can form an insert part which is produced separately from the cooling plate, which can be inserted into the cooling plate and which forms a part of the coolant line through the cooling plate in the state inserted into the cooling plate. The Venturi element can advantageously form an insert part which can be inserted into the cooling plate in the longitudinal direction of the coolant line and which can, for example, be pushed and/or screwed into a cooling plate side from an opening of the coolant line at said cooling plate side. The Venturi element can form an insert sleeve.

On a use of a Venturi nozzle, one pressure sensor can be provided or connected in front of the nozzle and one pressure sensor can be provided or connected in the narrow part of the Venturi passage. Since the flow speed is high there, the wall pressure drops greatly there in accordance with the known Bernouilli equation at the Venturi pipe. An advantage of the Venturi solution in this respect is that the pressure difference at the two pressure sensors is considerably larger than with use just of a baffle plate or of a step-shaped cross-sectional tapering. With the same pressure loss of the total measurement device, the measurement with the Venturi nozzle has a substantially greater measurement signal and thus a better resolution. The Venturi passage is advantageously designed as low turbulence for an exact measurement, in particular by a harmonious, gentle extent of the cross-sectional variations free of sharp corners or steps.

To facilitate a low turbulence design of the Venturi passage, an external production of the Venturi nozzle can take place on a lathe. The passage can in this respect be shaped as continuously "rotationally symmetrical" and both the intake and the drain of the narrow point can be designed with a slope to obtain a laminar flow. This increases the precision of the measurement device significantly. With a pure milling in the cooling body from the upper side, the cross-sections cannot truly be produced as rotationally symmetrical and higher turbulence phenomena are obtained. The use of a step drill would have already brought about a better approach to the objective, but can hardly achieve a rotationally symmetrical flaring behind the narrow passage or can only achieve it with difficulty.

The differential pressure gauge can advantageously not comprise a differential pressure sensor which is very expensive and awkward, but can rather comprise two pressure sensor elements which are connected to the measurement ports and which are connectable to the evaluation device, wherein the evaluation device has pressure differential determination means for determining the named pressure difference $\Delta P$ from the signals of the two pressure sensor elements.

In this respect, the pressure sensor elements can be installed and fastened directly at the cooling plate or at a sensor holder rigidly fastened to the cooling plate without the interposition of a piping. An exact measurement can hereby be achieved and additional components with corresponding space requirements can be avoided.

Independently of the provision of the named cross-sectional tapering, it can generally be advantageous to provide the measurement ports directly at the cooling body to allow a compact arrangement and a direct measurement at the cooling body. This is, however, not necessary; a corresponding tapering or the tapping over the measurement ports could also be provided at a coolant line section outside the cooling body.

If a plurality of cooling bodies are each preferably used in the form of cooling plates which are each traversed by a coolant line, the intakes of at least some of the cooling bodies can be connected to a common intake manifold and/or their drains can be connected to a common drain collector for a simple design of the piping or of the laying of the lines and to simplify the further handling of the cooling liquid or of the coolant.

With such a plurality of cooling bodies connected to a common intake manifold, it can be advantageous in a further development of the invention to provide a common measurement port in the region of the named intake manifold, whereby the number of measurement ports to be provided in total can be considerably reduced. Only one measurement port has to be provided at the cooling bodies themselves— although naturally a plurality of measurement ports could generally also be provided there—with such a measurement port being able to be provided at the respective cooling body, advantageously downstream of the previously described cross-sectional tapering. Each of the cooling plates can in this respect preferably have the named cross-sectional tapering, in particular in the form of a Venturi element.

With such an arrangement, the differential pressure gauge can preferably be connected in the form of the two pressure sensors to the common measurement point at the intake manifold, on the one hand, and to the respective measurement point of the respective cooling body, on the other hand, to determine the differential pressure between the intake manifold and the measurement point at the cooling body and to be able then to determine the flow quantity through the respective cooling body therefrom. A respective two measurement ports can advantageously also be provided at the cooling plates themselves and can be associated in the named manner with the respective cross-sectional tapering to obtain an increased measurement precision.

If the named plurality of cooling bodies of the cooling apparatus—or at least a subgroup of this plurality of cooling bodies—are connected or combined both at the intake side at a common intake manifold and at the drain side at a common drain collector, it can be advantageous in a further development of the invention also to provide a measurement port at the drain collector in addition to the previously named measurement port at the intake manifold so that the differential pressure sensor can determine the differential pressure between the intake manifold and the drain collector. While taking account of the respective one additional measurement port at the cooling bodies, the total flow quantity through the plurality of the cooling bodies and/or the part flow through a single cooling body can be determined while taking account of the total pressure difference between the inflow manifold and the outflow collector and the individual pressures at the individual cooling bodies, in particular downstream of the previously named Venturi element or of the previously named cross-sectional tapering. For example, the proportion of this cooling body in the total pressure loss can be determined from an individual pressure value which is measured at the one additional pressure port at a cooling body and the flow quantity through this one cooling body can be determined therefrom.

In order to allow a simple connection of the pressure sensors to the cooling plate or to the measurement ports provided thereat, the named measurement ports can have plug and/or screw connections to be able to link the pressure sensors simply by plugging on or screwing on. The named measurement points are in this respect advantageously configured as releasable so that the respective pressure sensor can be connected and released simply.

The pressure gauge can advantageously be connected without interposition of hoses directly to a respective cooling plate or to a port element rigidly connected thereto.

In an advantageous further development of the invention, the temperature of the coolant and/or the temperature of the cooling body is also taken into account in the determination of the flow quantity in order to be able to take account of temperature-dependent changes of the flow quantity, for example by temperature-dependent viscosity changes of the coolant and/or by changes of the coolant line cross-sections caused by thermal material expansions. In an advantageous further development of the invention, at least one temperature sensor can be provided at or in the cooling body, wherein, in a further development of the invention, each cooling body can have at least one temperature sensor on the use of a plurality of cooling bodies. In this respect, in an advantageous further development of the invention, a temperature measurement probe can be provided at the cooling body and can be connected via a signal line to the previously named evaluation unit device or evaluation unit so that the pressure values, on the one hand, and the temperature values, on the other hand, can run together in the evaluation unit.

The evaluation unit can advantageously be connected to a higher-order control which can, for example, control further components of the cooling apparatus, in particular in dependence on the detected flow quantity. For example, a cooling pump can be controlled in dependence on the determined flow quantity to set the flow quantity to a desired value. Alternatively or additionally, a fan can be switched on or switched off in dependence on the determined flow quantity and/or on the measured temperature. Alternatively or additionally, additional cooling bodies can be switched in via valves or additional cooling circuits can be started by setting a coolant pump into motion, wherein, in dependence on the design of the cooling apparatus, other parameters of the cooling apparatus can also be varied by the named higher-order control.

In an advantageous further development of the invention, the evaluation unit can be connected to the higher-order control via a bus system, for example via a field bus or via another cable connection.

The invention will be explained in more detail in the following with respect to preferred embodiments and to associated FIGS.

DETAILED DESCRIPTION

Figure 1:
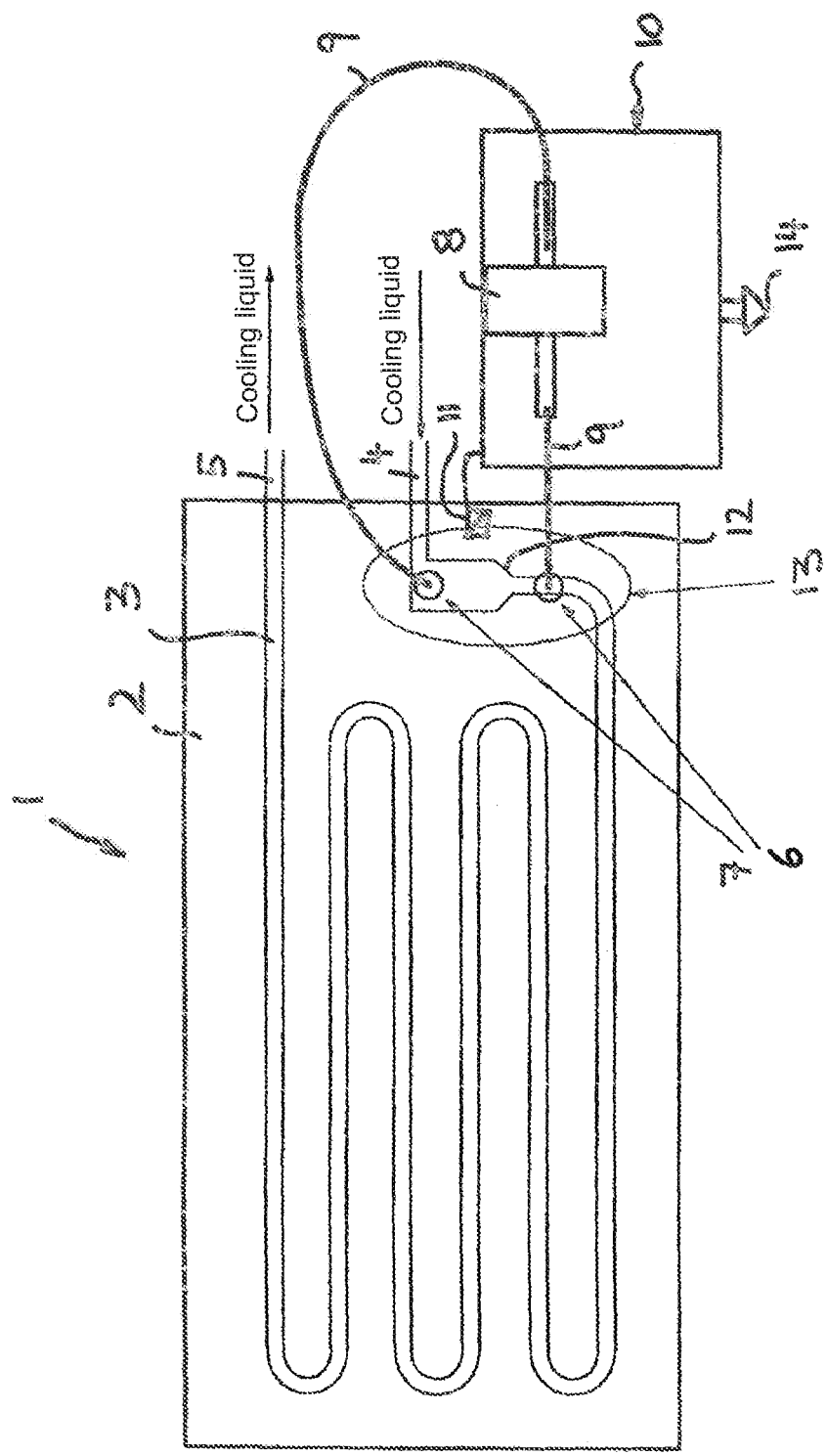
FIG. 1 shows a schematic representation of a cooling apparatus with a cooling body which is traversed by a coolant line, wherein the coolant line has a cross-sectional tapering and two associated measurement ports in the cooling body via which measurement ports the pressure sensors can be connected to the coolant line for determining a pressure difference.

As FIG. 1 shows, the cooling apparatus 1 can have a cooling body 2 in the form of a cooling plate or of a similar, flat, elongated body through which a coolant line 3 leads.

The coolant line 3 could generally be set onto the surface of the cooling body in the manner of a surface line. In an advantageous further development of the invention, the coolant line 3 can lead through the interior of the cooling body 2 or can be integrated or worked into the cooling body 2, wherein the cooling body 2 can have an intake port 4 and a drain port 5 which are in communication with the named coolant line 3 and which can be formed, for example, by ends of the named coolant line 3 projecting out of the cooling body 2 or by port stubs molded to the coolant body 3.

As FIG. 1 shows, the coolant line 3 can also wiggle in meandering form through the coolant body, but optionally also be led through the cooling body 2 in a different manner to realize a sufficient line length in the coolant body.

As FIG. 1 shows, two measurement ports 6 and 7 via which the coolant line can be tapped can advantageously be provided in the region of the cooling body 2 at a sufficient distance from one another. A differential pressure gauge 8 can be connected via the named measurement ports 6 and 7, with this being able to take place, for example, via measurement hoses 9 which connect the differential pressure sensor 8 to the respective measurement port 6 or 7.

In an advantageous further development of the invention, the named measurement ports 6 and 7 and the measurement hoses 9 can be formed as pneumatic parts. Optionally, however, hydraulic components or other pressure hoses or pressure lines can also be used.

The pressure drop across the path or the coolant line section between the two measurement ports 6 and 7 is determined via the differential pressure gauge 8, wherein the flow quantity through the cooling body 2 can be determined from this pressure difference by an evaluation device 10 with reference to the known geometry of the coolant line and possibly of further parameters such as of the viscosity of the coolant and/or of the temperature of the coolant or of the cooling body 2.

As FIG. 1 shows, the coolant line 3 in the cooling body 2 can advantageously have a cross-sectional tapering 12 between the measurement ports 6 and 7. The measurement ports 6 and 7 are advantageously provided, on the presence of such a cross-sectional tapering, at the constriction 13b of the cross-sectional tapering 12 or downstream of the cross-sectional tapering 12, on the one hand, and at a section of large diameter or of large cross-sectional surface upstream of the constriction 13b, on the other hand. In a further development of the invention, at least the measurement port 6 at the constriction side can in particular be provided directly at or in direct proximity to the named cross-sectional tapering 12, in particular at the narrowest line point. To achieve a compact port arrangement, it can also be advantageous to provide the second measurement port 7 provided upstream of the constriction directly upstream of the constriction in the region of the large cross-sectional section of the Venturi element 13.

In a further development of the invention, a temperature sensor 11 can be attached to the cooling body 2 and can be connected to the named evaluation device 10 via a suitable signal line.

The evaluation device 10 can advantageously be combined with the differential pressure sensor 8 to form a common assembly which can be formed separately from the cooling body 2 and which can be separated from the cooling body 2 by releasing the measurement hoses 9 and optionally the signal line to the temperature sensor 11. For this purpose, the measurement ports 6 and 7 can be releasable, for example in the form of releasable plug-in connections.

Figure 2:
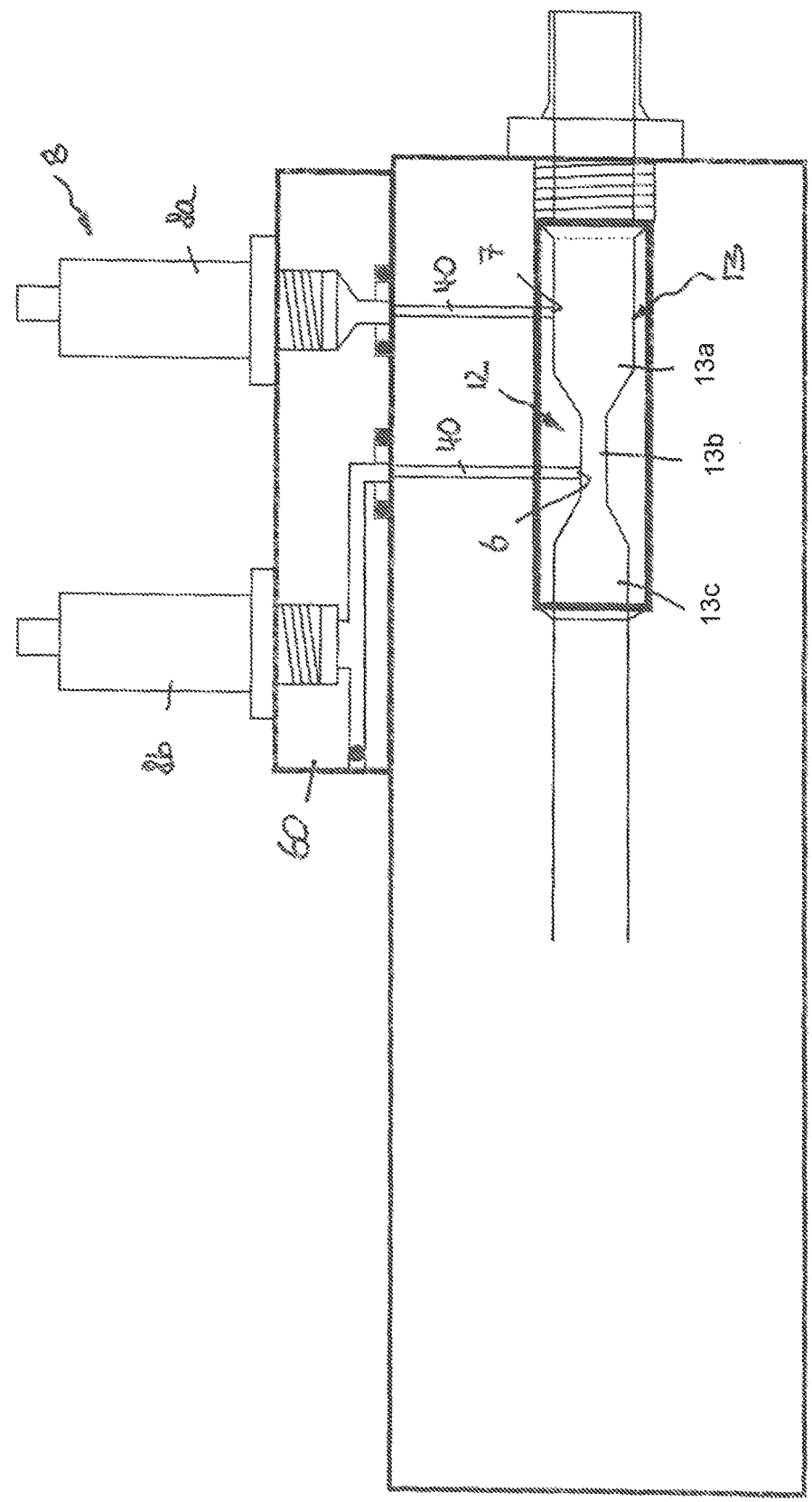
FIG. 2 shows a schematic representation of a cooling apparatus with a cooling body similar to FIG. 1, wherein the coolant line has a cross-sectional tapering in the form of a Venturi element in the cooling body and the measurement ports for the pressure sensor are provided upstream and downstream of the Venturi element, wherein the pressure sensors are installed directly at the cooling plate.

As FIG. 2 shows, the cross-sectional tapering 12 can advantageously be configured in the form of a Venturi element 13 or of another nozzle-like flow accelerator. The measurement ports 6 and 7 are advantageously provided, on the presence of such a cross-sectional tapering 12, at the constriction of the cross-sectional tapering 12 or downstream of the cross-sectional tapering 12, on the one hand, and at a section of large diameter or of large cross-sectional surface upstream of the constriction, on the other hand.

The Venturi element 13 can in particular have a constriction 13b which is adjoined by intake and drain sections 13a, 13c varying continuously in diameter upstream and downstream.

In this respect, the named one measurement port 6 can be provided at the constriction 13b of the Venturi element 13 and another one of the named measurement ports 7 can be arranged upstream of the intake section 13a of the Venturi element 13, in particular in a section, not yet tapered, of the coolant line 3 in the cooling plate directly upstream of the intake section 13a.

Figure 4:
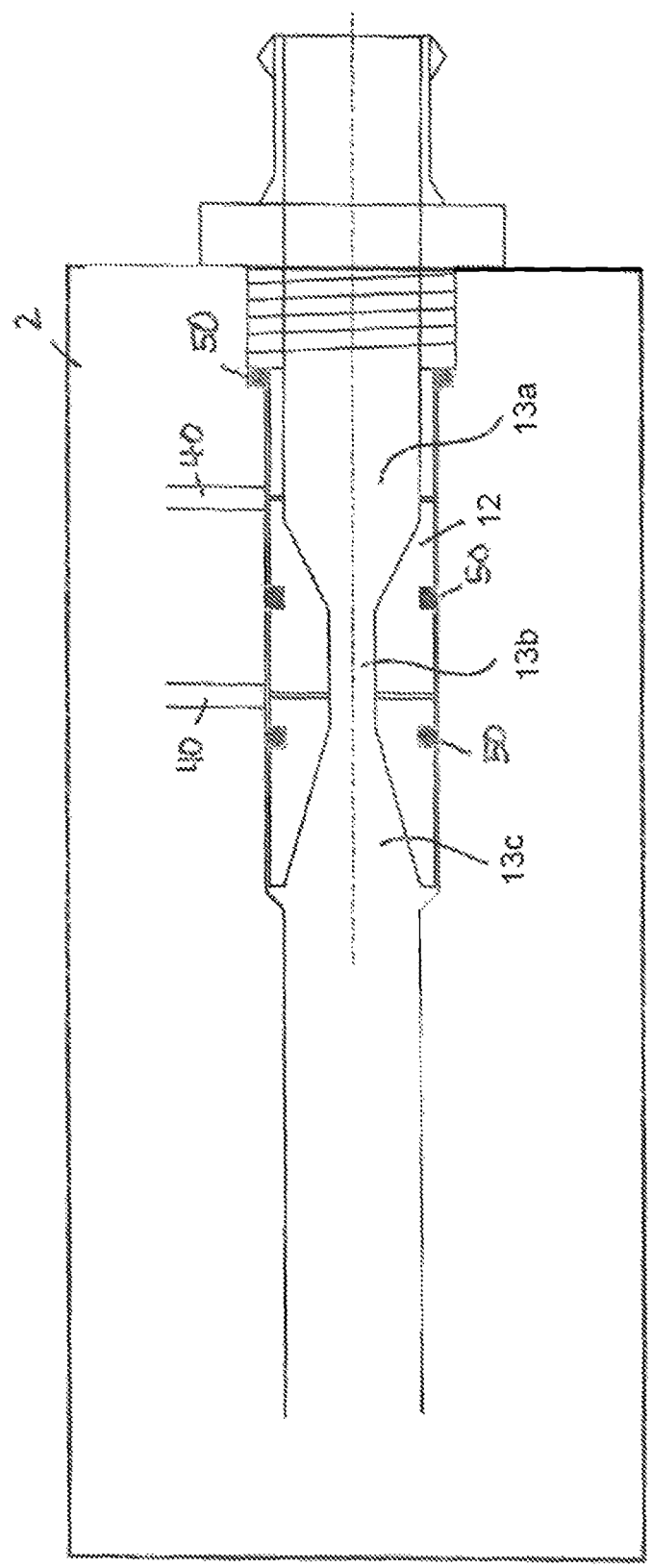
FIG. 4 shows a sectional, enlarged representation of the Venturi element formed as an insert part which forms the named cross-sectional tapering in the interior of the cooling plate.

Provision can in particular be made in this respect that the Venturi element 13 forms an insert part which can be inserted into the cooling plate and forms a part of the coolant line through the cooling plate in the cooling plate. As FIGS. 2 and 4 show, the sleeve-like Venturi insert element can be pushed or screwed into the coolant line 3 from a front side of the cooling plate 2 such that the inner cut-out of the insert part forms a part of the coolant passage and in this respect of its nozzle-shaped taper. Measurement ports can be guided in the form of transverse bores or transverse passages 40 to the insert part which can be sealed accordingly by seals 50 with respect to the passage in the cooling plate in order to be able to tap the pressure at the described points.

Figure 3:
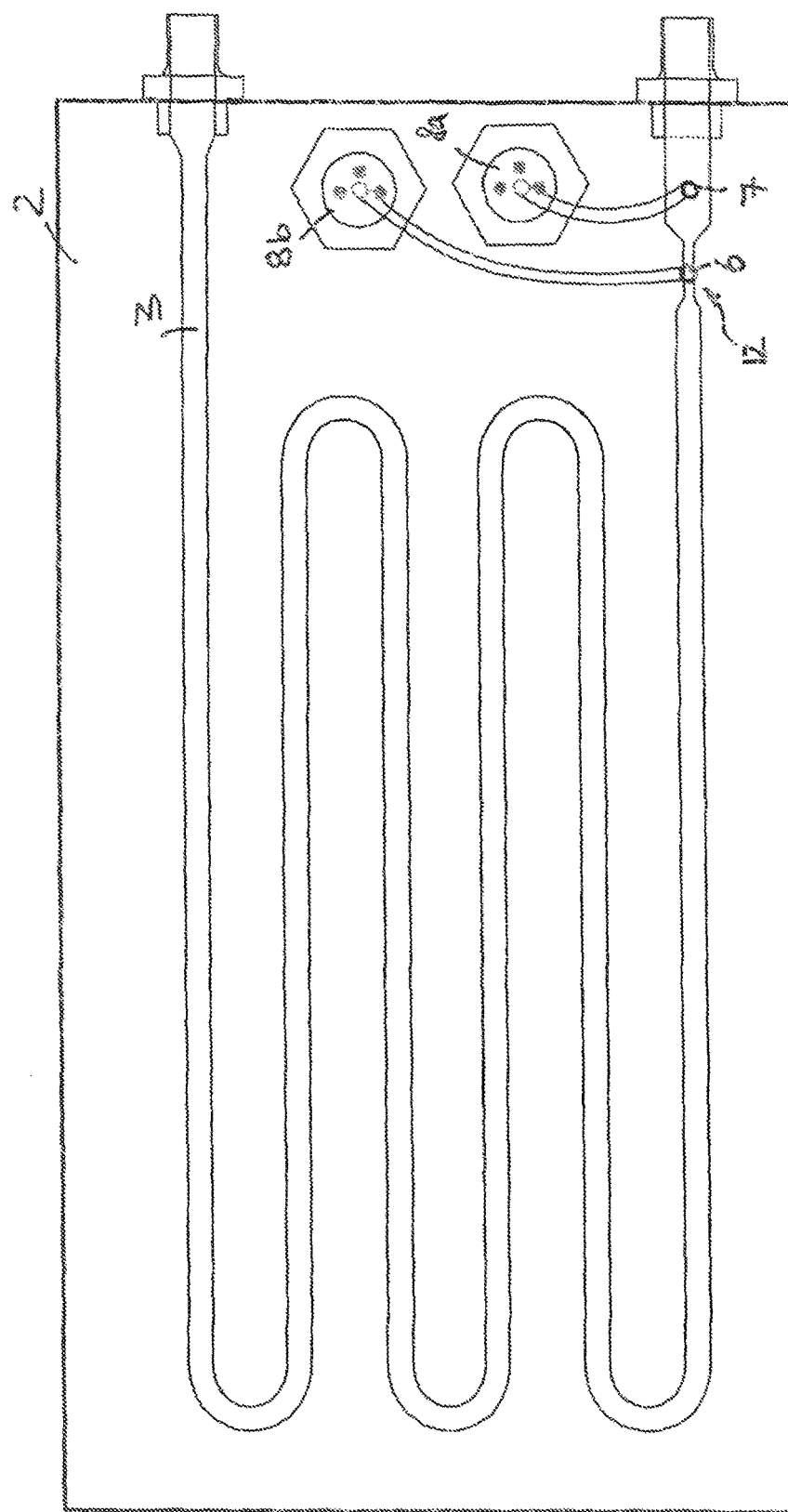
FIG. 3 shows a plan view of the cooling plate of FIG. 2 which shows the arrangement of the pressure sensors.

As FIGS. 2 and 3 show, the differential pressure gauge 8 can comprise two pressure sensor element 8a, 8b which are connectable to the measurement ports and which are connectable to the evaluation device 10 in a wireless manner or by a signal line, wherein the evaluation device 10 has pressure difference determination means for determining the named pressure difference $\Delta P$ from the signals of the two pressure sensor elements 8a, 8b.

The pressure sensor elements 8a, 8b are in this respect advantageously installed and fastened without interposition of a piping directly at the cooling plate or at a sensor holder rigidly fastened to the cooling plate, for example in the form of a holding flange 60 placed onto the actual cooling plate.

As FIGS. 1 and 2 show, it can be advantageous to arrange the named cross-sectional tapering 12 at an upstream-side or intake-side end section of the coolant line 3 in the cooling body 2.

Figure 5:
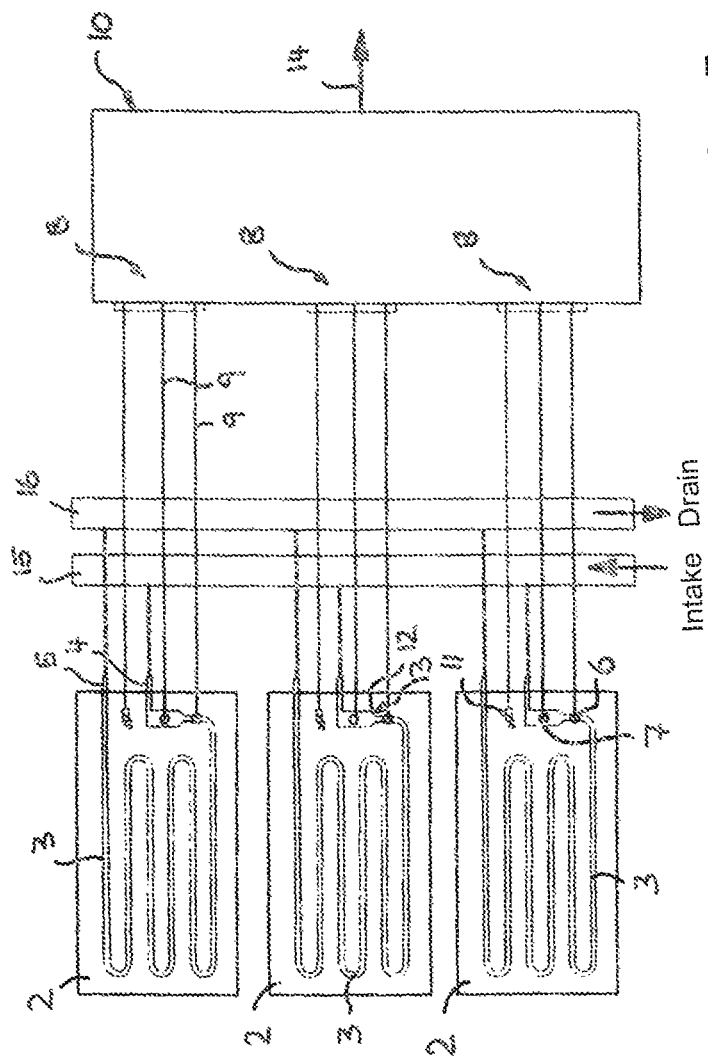
FIG. 5 shows a schematic representation of a cooling apparatus with a plurality of cooling bodies whose intakes are connected to a common intake manifold and whose drains are connected to a common drain collector, wherein the coolant lines in the cooling bodies each have a cross-sectional tapering in the form of a Venturi element and the measurement ports for differential pressure sensor are each arranged upstream and downstream of the named Venturi element such that the pressure difference, and from this the flow quantity, can be determined separately for each cooling body.

As FIG. 5 shows, the cooling apparatus 1 can also comprise a plurality of cooling bodies 2 which can each be configured similar to or in accordance with the cooling body 2 in accordance with FIG. 1 or in accordance with FIG. 2—in particular in the form of a cooling plate having an integrated Venturi element. As FIG. 5 shows, each of the cooling bodies 2 can in particular have a cross-sectional tapering 12 in the form of an inserted Venturi insert element 13, wherein the measurement port 6 and the measurement port 7 can be provided upstream and downstream of the constriction 13b or directly at the constriction 13b in order to be able to determine or measure the previously named pressure difference for each cooling body 2.

As FIG. 5 shows, the pressure sensors 8a and 8b associated with the cooling bodies 2 can be combined with the evaluation device 10 to form a central unit or a central evaluation unit, with the evaluation device 10 being able to be connected via a bus system 14 or via a bus to a higher-order control apparatus, not shown separately.

The evaluation device 10 can determine the flow quantity of the cooling bodies via the linking of the differential pressure sensors 8 to the measurement ports 6 and 7 of the respective cooling bodies 2 and can determine the total flow quantity of the system from the flow quantities of the individual cooling bodies 2.

As FIG. 5 shows, respective temperature sensors 11 can be attached to the cooling bodies 2 and can likewise be connected to the evaluation device 10 via signal lines in order to be able to take account of temperature dependencies on the determination of the flow quantities.

The intakes 4 of the plurality of cooling bodies 2 can advantageously be connected to a common intake manifold 15 and their drains 5 can be connected to a common drain collector 16.

Figure 6:
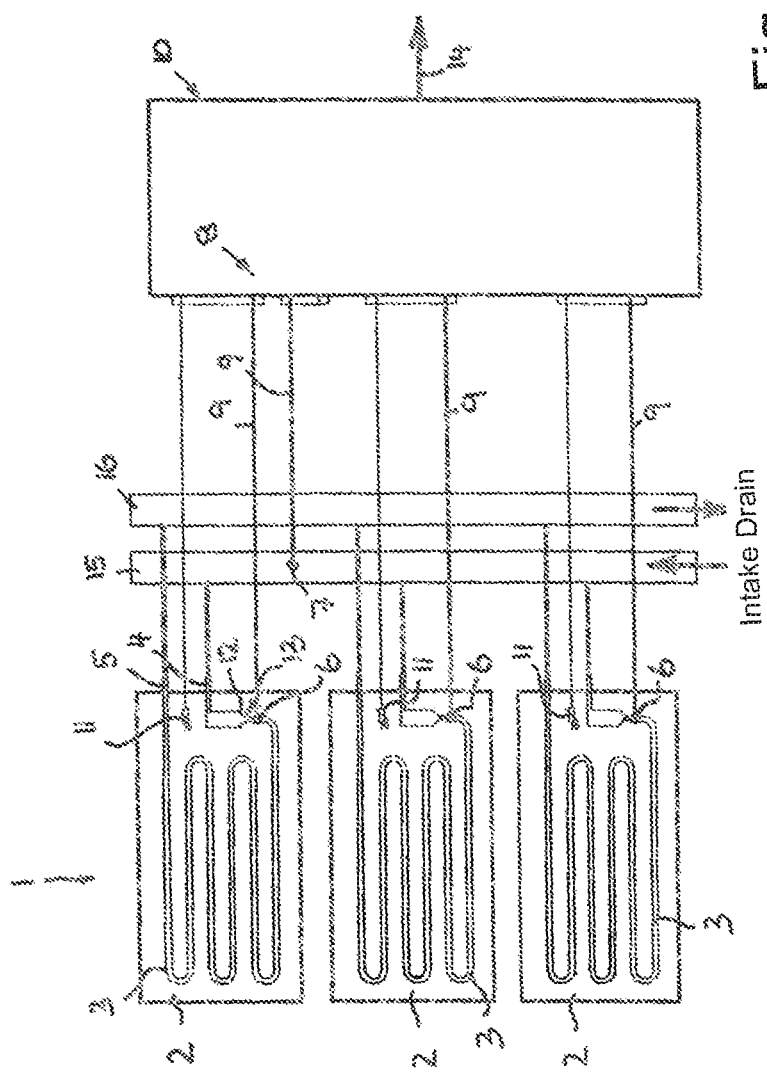
FIG. 6 shows a schematic representation of a cooling apparatus with a plurality of cooling bodies similar to FIG. 5, wherein the intakes of the plurality of cooling bodies are here also connected to a common intake manifold and the drains are connected to a common drain collector, wherein each cooling body has only one measurement port, in particular at the constriction of the Venturi element, whereas a common measurement point is provided in the region of the intake manifold upstream of the Venturi element for all cooling bodies.

As FIG. 6 shows, the number of measurement ports at the plurality of cooling bodies 2 can be reduced in that a common measurement port 7 is provided at the intake manifold 15, whereas only one further measurement port 6 is provided at each cooling body 2 and can be provided advantageously in the previously described manner to the constriction or downstream of the constriction of the cross-sectional tapering 12 in the coolant line 3. The evaluation device 10 can in this respect determine the pressure difference for each cooling body 2 from the common, central measurement port 7 which is provided at the intake manifold 15, on the one hand, and from the measurement port 6 at the respective cooling body 2 or from the pressure values respectively tapped there, on the other hand. In comparison with the embodiment of FIG. 3, only four pressure measurement ports are hereby necessary instead of six pressure measurement ports.

In another respect, the embodiment of FIG. 6 corresponds to the embodiment of FIG. 5 so that reference can be made to the preceding description.

Figure 7:
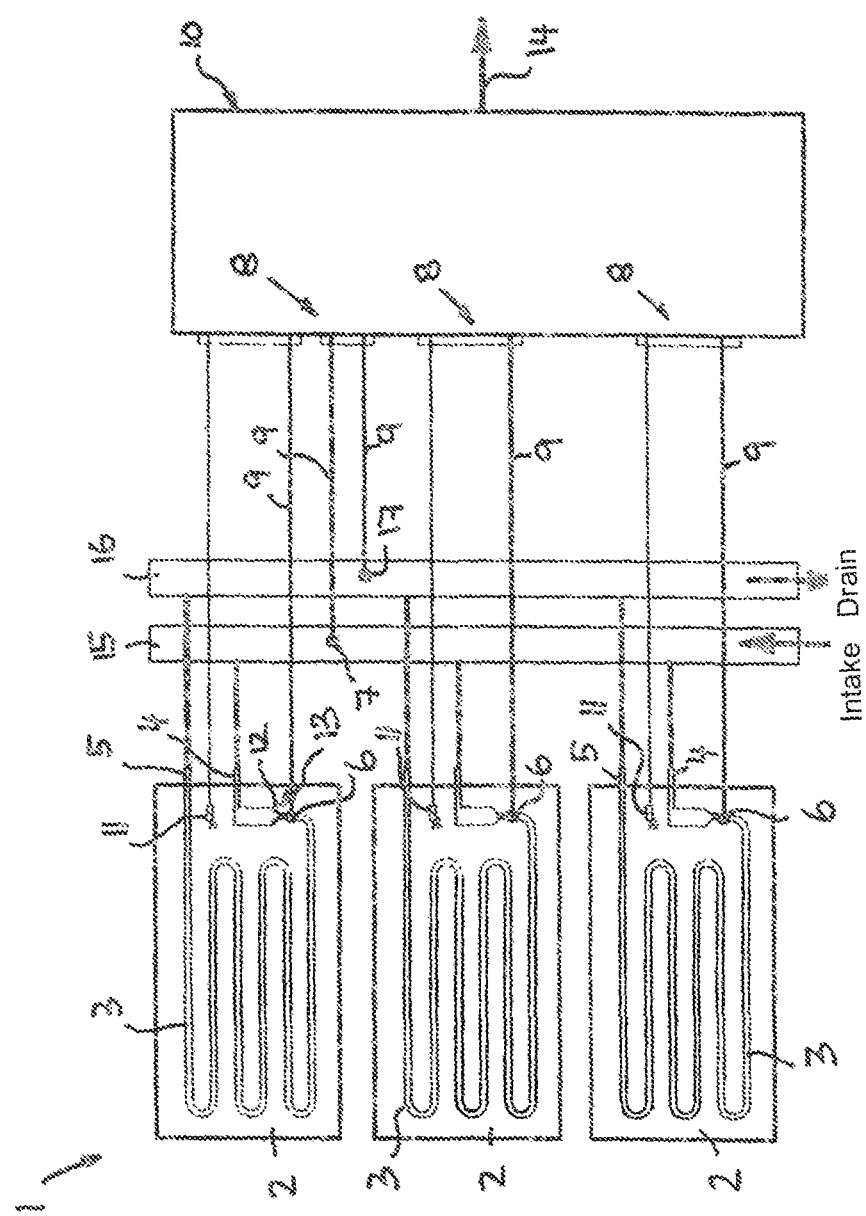
FIG. 7 shows a schematic representation of a cooling apparatus with a plurality of cooling bodies similar to FIGS. 5 and 6, wherein the intakes of the plurality of cooling bodies are here also connected to a common intake manifold and the drains are connected to a common drain collector, wherein a respective measurement port for the differential pressure sensor is provided at the intake manifold and at the drain collector and a further measurement port is provided at each cooling body, in particular at the constriction of the Venturi element.

As FIG. 7 shows, it can be advantageous to provide a measurement port 7 and 17 both at the intake manifold 15 and at the drain manifold 16 in order to be able to determine the differential pressure between the intake manifold 15 and the drain manifold 16 and thus over the total system of the plurality of cooling bodies 2. In addition, similar to FIG. 6, a further measurement port 6 is provided at each cooling body 2, in particular at the constriction or downstream of the constriction of the cross-sectional tapering 12. The evaluation device 10 can determine the total flow quantity through the plurality of cooling bodies 2, on the one hand, and the individual flow quantity through a single cooling body, on the other hand, from the pressure difference between the intake manifold 15 and the drain collector 16 as well as while taking account of the pressure values at the constriction of the cross-sectional taperings 12 at the individual cooling bodies 2.

In another respect, the embodiment of FIG. 7 corresponds to the previously described embodiment of FIG. 6 so that reference can also be made to the previous description here.

The invention claimed is:

1. A cooling apparatus for power electronic components comprising:
   a plurality of cooling bodies each in a form of a cooling plate;
   a flow determination device comprising an evaluation device for determining a flow quantity flowing through each cooling plate;
   a common intake manifold connected to a plurality of coolant lines, each coolant line of the plurality of coolant lines leading through a respective cooling body of the plurality of cooling bodies, wherein a coolant is flowed through each of the plurality of coolant lines, and wherein each coolant line has a cross-sectional tapering inside the respective cooling plate;
   a common measurement port arranged at the common intake manifold; and
   a plurality of additional measurement ports, each additional measurement port arranged within a respective coolant line within a respective cooling plate at or directly downstream of the respective cross-sectional tapering,
   wherein a differential pressure gauge is connectable to the common measurement port at the common intake manifold and to each additional measurement port to measure a pressure difference inside each respective cooling plate, and
   wherein the evaluation device determines the flow quantity through each respective cooling body from respective pressure differences between the common intake manifold and each respective additional measurement port.

2. The cooling apparatus in accordance with claim 1, further comprising an outflow measurement port provided at an outflow collector coupled downstream of each cooling body, wherein a differential pressure between the common intake manifold and the outflow collector is determined by the differential pressure gauge, and wherein individual flow quantities through individual cooling bodies and a total flow quantity through all the cooling bodies is determined by the evaluation device from the pressure difference between the common intake manifold and the outflow collector as well as from pressure values at the individual cooling bodies.

3. The cooling apparatus in accordance with claim 2, wherein the measurement ports are configured as releasable plug-in ports or screw-in ports.

4. The cooling apparatus in accordance with claim 1, wherein the evaluation device is connectable via a bus to a higher-order control apparatus for controlling at least one operating parameter of the cooling apparatus.

\* \* \* \* \*